(12) United States Patent
Jang et al.

(10) Patent No.: US 9,825,058 B2
(45) Date of Patent: Nov. 21, 2017

(54) OXIDE SEMICONDUCTOR TRANSISTOR USED AS PIXEL ELEMENT OF DISPLAY DEVICE AND MANUFACTURING METHOD THEREFOR

(71) Applicant: University-Industry Cooperation Group of Kyung Hee University, Yongin, Gyeonggi-Do (KR)

(72) Inventors: Jin Jang, Seoul (KR); Man Ju Seok, Seoul (KR); Jae Gwang Um, Seoul (KR); Su Hui Lee, Seoul (KR)

(73) Assignee: University-Industry Cooperation Group of Kyung Hee University, Yongin, Gyeonggi-do (KR)

( * ) Notice: Subject to any disclaimer, the term of this patent is extended or adjusted under 35 U.S.C. 154(b) by 0 days.

(21) Appl. No.: 14/965,059

(22) Filed: Dec. 10, 2015

(65) Prior Publication Data

US 2016/0093643 A1 Mar. 31, 2016

Related U.S. Application Data

(63) Continuation of application No. PCT/KR2014/004232, filed on May 12, 2014.

(30) Foreign Application Priority Data

Jun. 11, 2013 (KR) .................. 10-2013-0066693
Dec. 10, 2013 (KR) .................. 10-2013-0153421

(51) Int. Cl.
*H01L 29/10* (2006.01)
*H01L 27/12* (2006.01)
(Continued)

(52) U.S. Cl.
CPC ........ *H01L 27/1225* (2013.01); *H01L 21/563* (2013.01); *H01L 23/3171* (2013.01);
(Continued)

(58) Field of Classification Search
CPC .............. H01L 29/24; H01L 29/41733; H01L 29/42376; H01L 29/42384;
(Continued)

(56) References Cited

U.S. PATENT DOCUMENTS 8,901,562 B2 * 12/2014 Yamada ............ H01L 27/14663
257/412
8,907,348 B2 * 12/2014 Miyairi ............... H01L 27/1225
257/258

(Continued)

FOREIGN PATENT DOCUMENTS

JP 2010-123938 A 6/2010
JP 2010-153828 A 7/2010
(Continued)

OTHER PUBLICATIONS

Joon Seok etc, "High Performance and Stability of Double-Gate Hf—In—Zn—O Thin-Film Transistors Under Illumination," IEEE Electron Device Letters ( vol. 31, Issue: 9, Sep. 2010 ).*

*Primary Examiner* — Mark Tornow
(74) *Attorney, Agent, or Firm* — Mintz Levin Cohn Ferris Glovsky and Popeo, P.C.; Kongsik Kim; Jonathon Western

(57) ABSTRACT

An oxide semiconductor transistor used in a pixel element of a display device and a method of manufacturing the same are disclosed. The oxide semiconductor transistor used in a pixel element of a display device comprises a substrate, a first gate electrode located on the substrate, a source electrode and a drain electrode located on the first gate electrode and a second gate electrode located on the source electrode and the drain electrode. Here, the first gate electrode is electrically connected to the second gate electrode, the same voltage is applied to the first gate electrode and the second gate electrode, and a width of the second gate electrode is shorter (Continued)

than a length between the source electrode and the drain electrode.

9 Claims, 22 Drawing Sheets

(51) Int. Cl.
    *H01L 29/786*     (2006.01)
    *H01L 21/56*     (2006.01)
    *H01L 23/31*     (2006.01)
    *H01L 29/24*     (2006.01)
    *H01L 29/417*     (2006.01)
    *H01L 29/423*     (2006.01)
    *H01L 29/66*     (2006.01)

(52) U.S. Cl.
    CPC ........ *H01L 27/124* (2013.01); *H01L 27/1259* (2013.01); *H01L 29/24* (2013.01); *H01L 29/41733* (2013.01); *H01L 29/42376* (2013.01); *H01L 29/42384* (2013.01); *H01L 29/7869* (2013.01); *H01L 29/78648* (2013.01); *H01L 29/66969* (2013.01); *H01L 2924/0002* (2013.01)

(58) Field of Classification Search
    CPC ........... H01L 29/78648; H01L 29/7869; H01L 27/1225; H01L 27/124; H01L 27/1259; H01L 21/563
    See application file for complete search history.

(56) References Cited

U.S. PATENT DOCUMENTS

2001/0030323 A1* 10/2001 Ikeda ................ H01L 29/78645
    257/59
2013/0270563 A1* 10/2013 Yamazaki ......... H01L 29/78609
    257/57

FOREIGN PATENT DOCUMENTS

| KR | 10-2009-0084642 A | 8/2009 |
| KR | 10-2011-0037220 A | 4/2011 |
| KR | 10-2012-0070709 A | 7/2012 |

* cited by examiner

FIG. 4
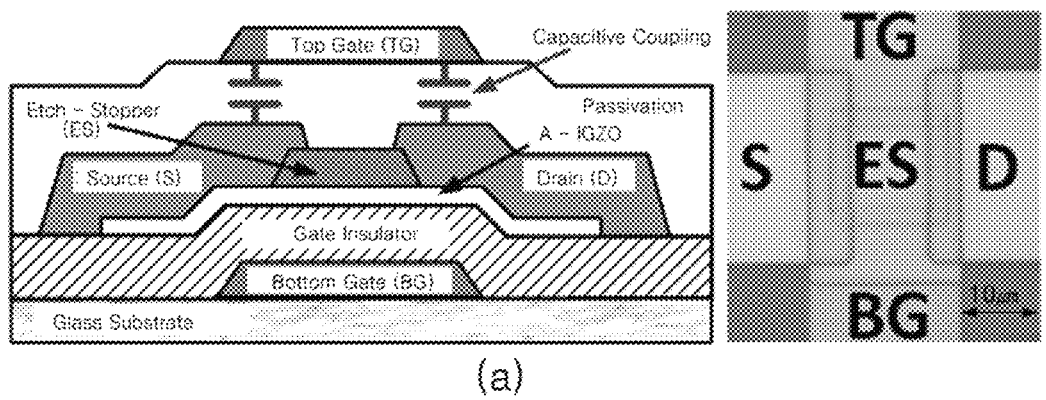
(a)
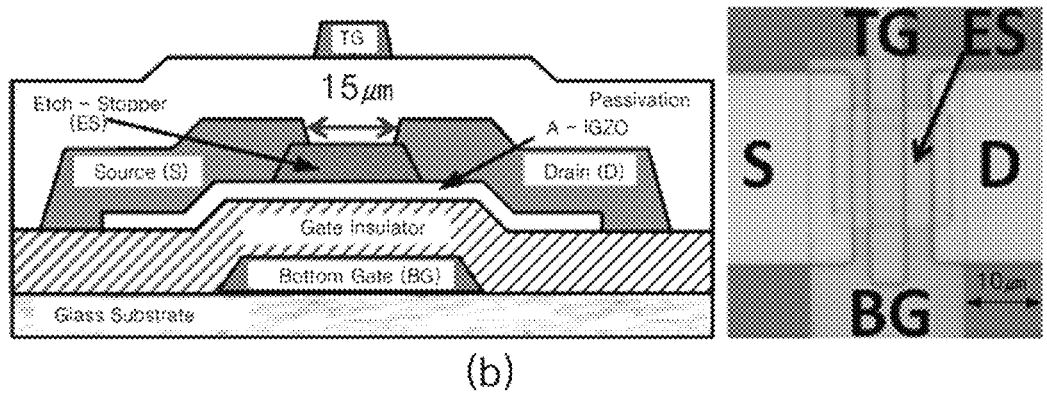
(b)

FIG. 7
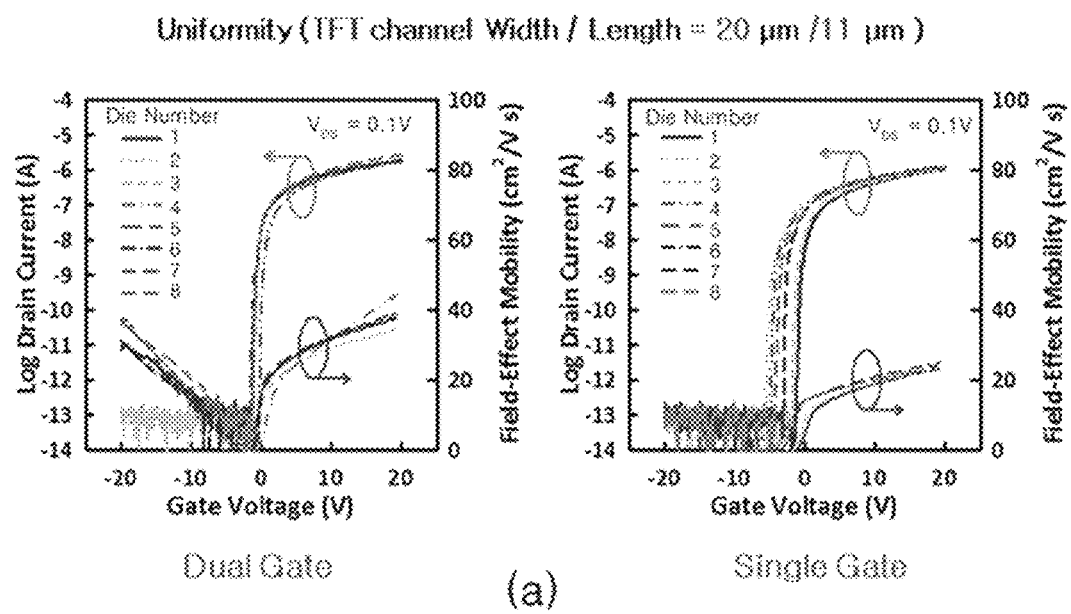
(a)
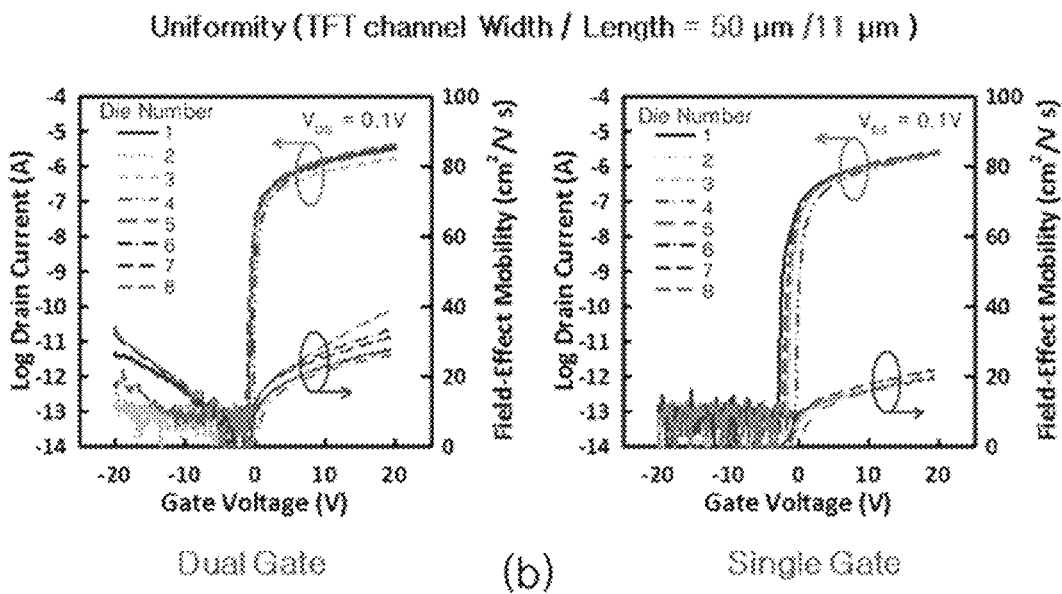
(b)

FIG. 8
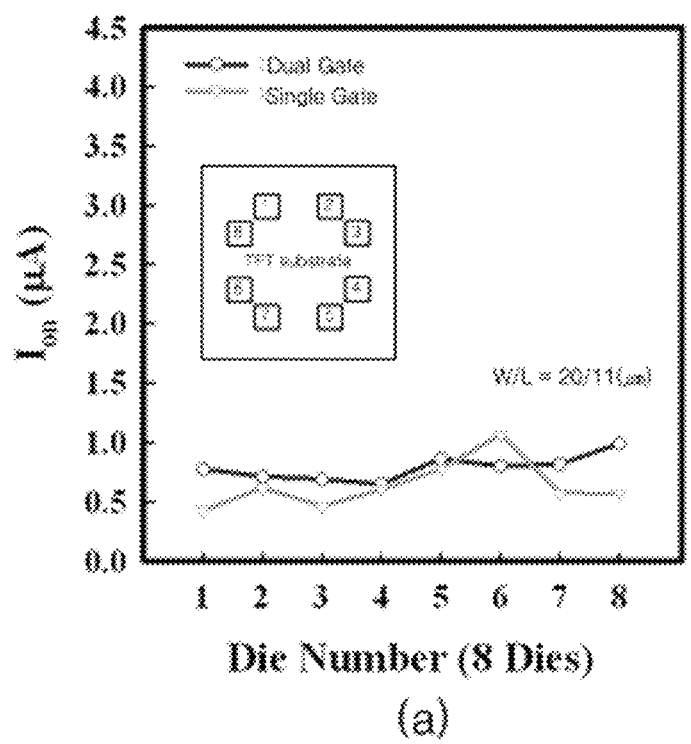
(a)
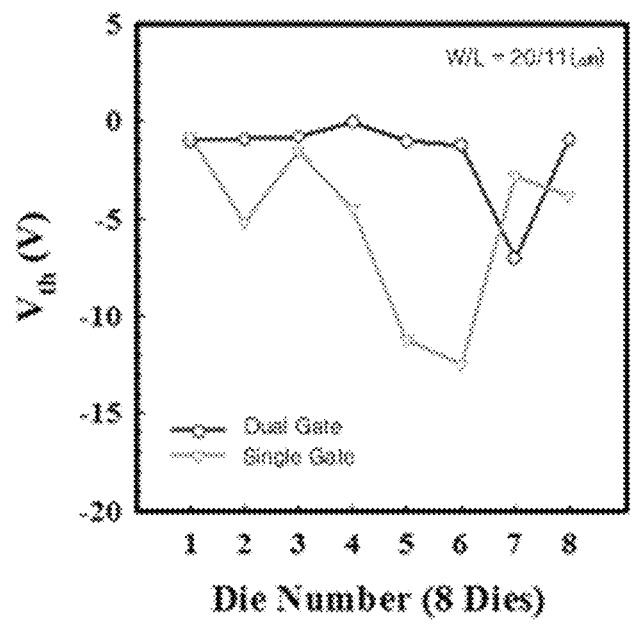
(b)

OXIDE SEMICONDUCTOR TRANSISTOR USED AS PIXEL ELEMENT OF DISPLAY DEVICE AND MANUFACTURING METHOD THEREFOR

CROSS-REFERENCE TO RELAYED APPLICATIONS

This is a continuation application of International Application No. PCT/KR2014/004232 filed on May 12, 2014, which claims priority to Korean Application No. 10-2013-0066693 filed on Jun. 11, 2013 and Korean Application No. 10-2013-0153421 filed on Dec. 10, 2013. The applications are incorporated herein by reference.

TECHNICAL FIELD

The present disclosure relates to an oxide semiconductor transistor used in a pixel element of a display device having high performance electrical characteristics and a method of manufacturing the same.

BACKGROUND ART

Recently, a display device driven by a driving unit using an indium gallium zinc oxide a-IGZO which is an oxide semiconductor has been rapidly developed. Additionally, study about an inverter needed basically for driving the display device and a driving circuit using the inverter has been considerably progressed.

Korean laid open patent No. 10-2012-0087910 as a related technique discloses an oxide semiconductor thin film transistor having a etch/stopper E/S typed dual gate structure.

However, in the conventional oxide semiconductor thin film transistor, a bottom gate and a top gate are electrically separated, and a voltage is not applied to the top gate.

On the other hand, the oxide semiconductor thin film transistor may operate with a depletion mode in the event that specific voltage is applied to the top gate. However, the problem exists in that electrical characteristics of the transistor is deteriorated if a voltage applied to the top gate is different from that applied to the bottom gate.

A parasitic voltage occurs between the top gate and a source electrode/a drain electrode, thereby deteriorating characteristics of the oxide semiconductor thin film transistor having high performance electrical characteristics.

Furthermore, the problem exists in that electrical characteristics of the a-IGZO thin film transistor are terribly changed in view of negative bias illumination stress NBIS which is one of reliability testing of the oxide semiconductor thin film transistor.

SUMMARY

To solve substantially obviate one or more problems due to limitations and disadvantages of the background art, one embodiment of the invention provides an oxide semiconductor transistor used in a pixel element of a display device having high performance electrical characteristics and a method of manufacturing the same.

Another embodiment of the invention provides an oxide semiconductor transistor used in a pixel element of a display device for enhancing reliability in view of negative bias illumination stress NBIS and a method of manufacturing the same.

Other embodiments of the invention may be easily thought by a person in the art through below embodiments.

An oxide semiconductor transistor used in a pixel element of a display device according to one embodiment of the invention includes a substrate; a first gate electrode located on the substrate; a source electrode and a drain electrode located on the first gate electrode; and a second gate electrode located on the source electrode and the drain electrode. Here, the first gate electrode is electrically connected to the second gate electrode, the same voltage is applied to the first gate electrode and the second gate electrode, and a width of the second gate electrode is shorter than a length between the source electrode and the drain electrode.

An oxide semiconductor transistor used in a pixel element of a display device according to another embodiment of the invention includes a substrate; a first gate electrode located on the substrate; a source electrode and a drain electrode located on the first gate electrode; and a second gate electrode located on the source electrode and the drain electrode. Here, the first gate electrode and the second gate electrode locate on the same axis, a width of the second gate electrode is shorter than a width of the first gate electrode, the first gate electrode is electrically to the second gate electrode, and the same voltage is applied to the first gate electrode and the second gate electrode.

A method of manufacturing an oxide semiconductor transistor used in a pixel element of a display device according to still another embodiment of the invention includes forming a first gate electrode on a substrate; forming sequentially a gate insulator, an oxide semiconductor layer and an etch stopper on the first gate electrode; forming a source electrode/a drain electrode on the gate insulator, the oxide semiconductor layer and the etch stopper, forming a passivation layer on the source electrode/the drain electrode; and forming a connection electrode for connecting electrically the first gate electrode to the second gate electrode. Here, a width of the second gate electrode is shorter than a length between the source electrode and the drain electrode.

In one embodiment of the invention, an oxide semiconductor transistor used in a pixel element of a display device may have enhanced high performance electrical characteristics.

Additionally, the oxide semiconductor transistor may enhance reliability in view of NBIS and realize high performance electrical characteristics.

BRIEF DESCRIPTION OF DRAWINGS

Example embodiments of the present invention will become more apparent by describing in detail example embodiments of the present invention with reference to the accompanying drawings, in which:

FIG. 4 is a view illustrating comparison of an oxide semiconductor transistor where a width of the second gate electrode is longer than that of the first gate electrode and that between the source electrode and the drain electrode and an oxide semiconductor transistor where a width of the second gate electrode is smaller than that of the first gate electrode and that between the source electrode and the drain electrode;

FIG. 7 is a view illustrating a graph showing a transfer curve of the oxide semiconductor transistor according to one embodiment of the invention;

FIG. 8 is a view illustrating a graph showing drain current and a threshold voltage of the oxide semiconductor transistor 100 according to one embodiment of the invention;

DETAILED DESCRIPTION

Figure 1:
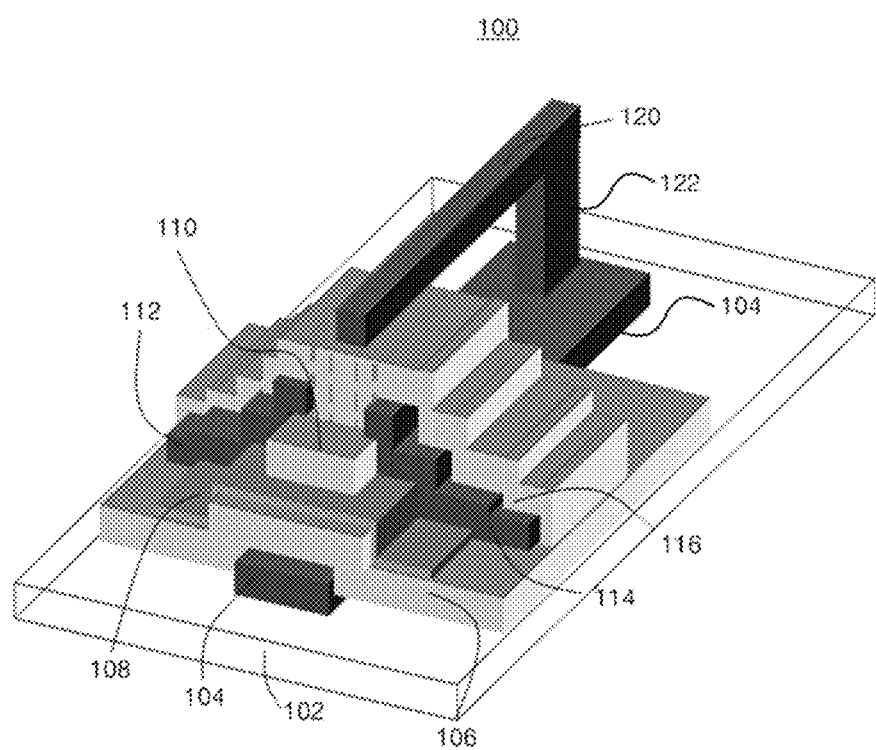
FIG. 1 is a perspective view illustrating an oxide semiconductor transistor according to one embodiment of the invention.

The invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Hereinafter, embodiments of the invention will be described in detail with reference to accompanying drawings.

Figure 2:
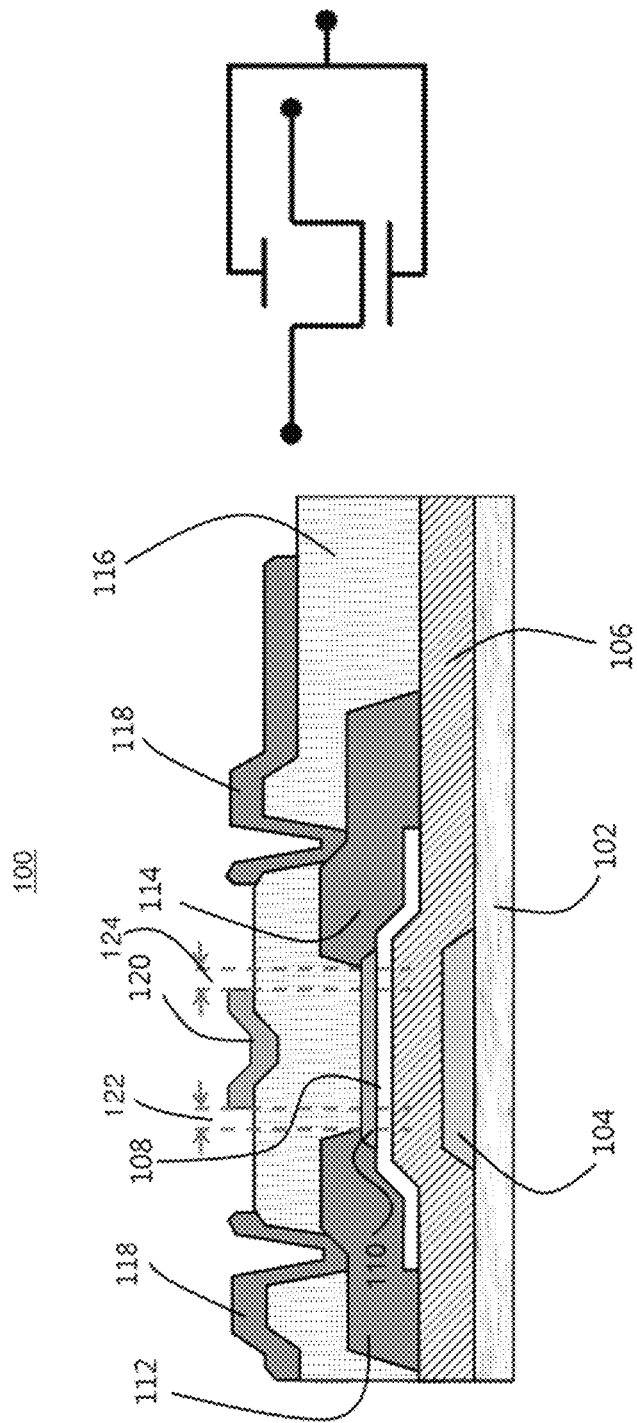
FIG. 2 is a sectional view and an equivalent circuit illustrating the oxide semiconductor transistor according to one embodiment of the invention.
Figure 3:
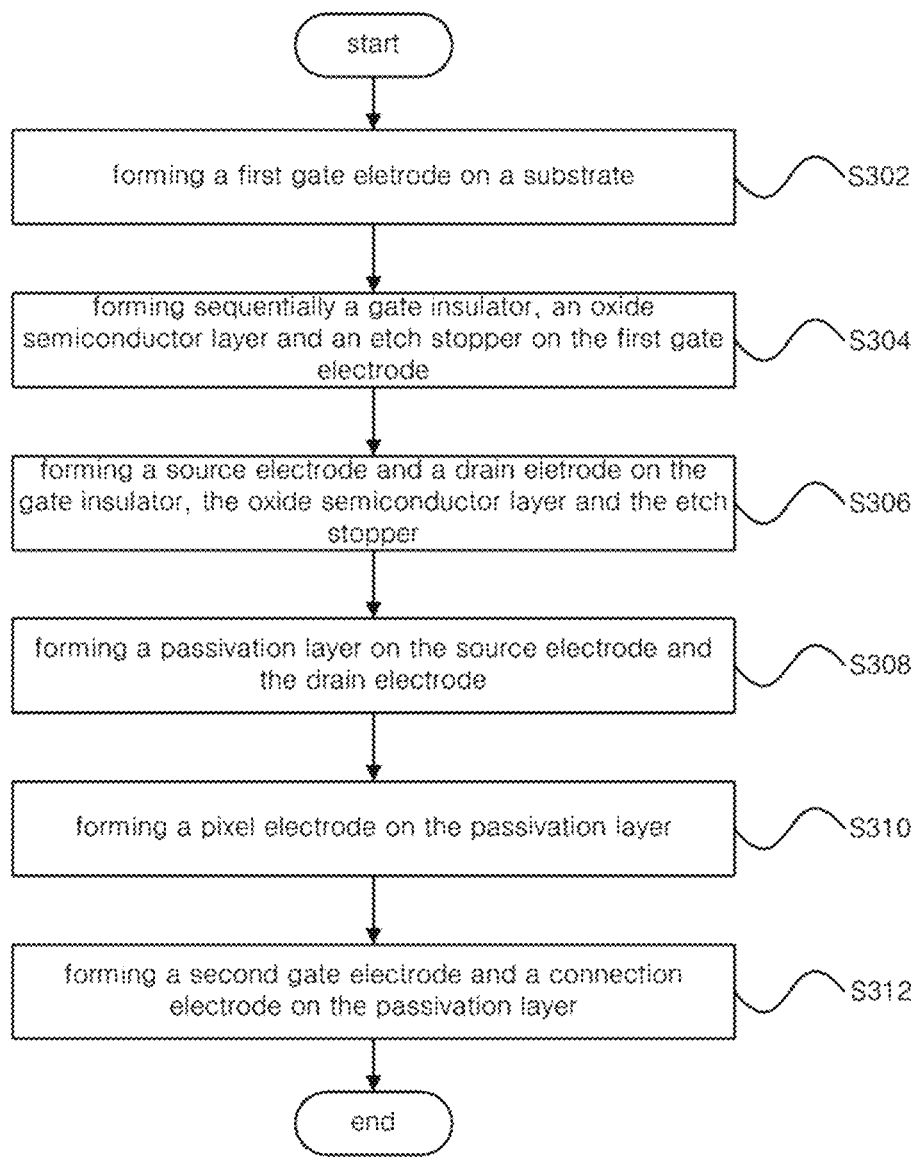
FIG. 3 is a flowchart illustrating a method of manufacturing an oxide semiconductor transistor according to one embodiment of the invention.

FIG. 1 is a perspective view illustrating an oxide semiconductor transistor according to one embodiment of the invention, and FIG. 2 is a sectional view and an equivalent circuit illustrating the oxide semiconductor transistor according to one embodiment of the invention. FIG. 3 is a flowchart illustrating a method of manufacturing an oxide semiconductor transistor according to one embodiment of the invention.

The oxide semiconductor transistor of the present embodiment means a transistor used in a pixel element of a display device, i.e. used for driving light emitting diodes in the display device. Referring to FIG. 1 and FIG. 2, the oxide semiconductor transistor 100 (hereinafter, referred to as "oxide semiconductor transistor for the display device) includes a substrate 102, a gate electrode 104, a gate insulator 106, an oxide semiconductor layer 108, an etch stopper 110, a source electrode 112, a drain electrode 114, a passivation layer 116, a pixel electrode 118, a second gate electrode 120 and a connection electrode 122.

The oxide semiconductor transistor 100 of the display device may be an oxide semiconductor thin film transistor TFT.

Hereinafter, function of elements in the oxide semiconductor transistor 100 of the display device and a method of manufacturing the oxide semiconductor transistor will be described in detail with reference to accompanying FIG. 1 to FIG. 3.

In a step of S302, the first gate electrode 104 is formed on the substrate 102.

The substrate 102 may be made up of a glass, a plastic or a quartz, and the first gate electrode 104 as a bottom gate is formed on the substrate 102.

The first gate electrode 104 may be formed by depositing a gate conductive film on the substrate 102, forming a photoresist pattern on the gate conductive film and then etching selectively, i.e. patterning the gate conductive film by using the photoresist pattern as a mask. The first gate electrode 104 may be made up of a metal, e.g. Molybdenum Mo.

In a step of S304, the gate insulator 106, the oxide semiconductor layer 108 and the etch stopper 110 are formed (deposited and patterned) in sequence on the first gate electrode 104.

Particularly, the gate insulator 106 and the oxide semiconductor layer 108 are formed (deposited and patterned) in sequence on the first gate electrode 104.

In one embodiment, the gate insulator 106 may be an oxide or a metal oxide. For example, the gate insulator 106 may be a silicon oxide $SiO_2$.

In one embodiment, the oxide semiconductor layer 108 may include an indium In. For example, the oxide semiconductor layer 108 may have an amorphous or polycrystalline structure formed with any one of an indium gallium zinc oxide IGZO, a zinc oxide ZnO, an indium zinc oxide IZO, an indium tin oxide ITO, a zinc tin oxide ZTO, a gallium zinc oxide GZO, a hafnium indium zinc oxide HIZO, a zinc indium tin oxide ZITO and an aluminum zinc oxide AZTO. The oxide semiconductor layer 108 may be formed on an upper part (e.g. point on the same axis) of the first gate electrode 104.

The etch stopper 110 is formed on the oxide semiconductor layer 108. Here, the etch stopper 110 may be made up of an oxide or a metal oxide (for example, silicon oxide $SiO_2$). The etch stopper 110 may be formed on the upper part (e.g. point of the same axis) of the first gate electrode 104.

In a step of S306, the source electrode 112 and the drain electrode 114 are formed on the gate insulator 106, the oxide semiconductor layer 108 and the etch stopper 110.

Here, the source electrode 112 and the drain electrode 114 are formed in parallel with each other. Accordingly, a part of the etch stopper 110 locates on a channel part between the source electrode 112 and the drain electrode 114 as shown in FIG. 1 and FIG. 2. The source electrode 112 and the drain electrode 114 may be a metal, e.g. Molybdenum Mo.

In a step of S308, the passivation layer 116 is formed on the source electrode 112 and the drain electrode 114. For example, the passivation layer 116 may be made up of an oxide or a metal oxide (for example, silicon oxide $SiO_2$).

In a step of S310, a pixel electrode 118 (not shown in FIG. 1) is formed on the passivation layer 116.

The pixel electrode 118 is respectively connected to the source electrode 112 and the drain electrode 114, and connects electrically the source electrode 112 and the drain electrode 114 to external element of the oxide semiconductor transistor 100 of the display device. The pixel electrode 118 may be also made up of a metal, e.g. Molybdenum Mo.

In a step of S312, the second gate electrode 120 and the connection electrode 122 are formed on the passivation layer 116.

The second gate electrode 120 as a top gate is made up of a metal electrode for blocking a light or transparent metal electrode for passing a light, and locates on a part of the passivation layer 116 corresponding to the upper part (e.g. upper part on the same axis) of the first gate electrode 104 in view of a sectional view. Accordingly, the etch stopper 110 and the second gate electrode 120 may locate sequentially on the upper part of the first gate electrode 104.

The connection electrode 122 connects electrically the first gate electrode 104 to the second electrode 120. Accordingly, the same voltage may be applied to the first gate electrode 104 and the second gate electrode 120 via the connection electrode 122.

In one embodiment, the first gate electrode 104 and the second gate electrode 120 locate on the same axis. In a plan view, the second gate electrode 120 may be overlapped with the first gate electrode 104, and the second gate electrode 120 may locate in a space between the source electrode 112 and the drain electrode 114. In a sectional view, a width of the second gate electrode 120 may be smaller than that of the first gate electrode 104, and may be shorter than that between the source electrode 112 and the drain electrode 114 (i.e. width of a channel between one terminal of the source electrode 112 and one terminal of the drain electrode 114 formed in parallel with each other).

Particularly, FIG. 4 compares an oxide semiconductor transistor 100 (referring to (a) in FIG. 4) where a width of the second gate electrode 120 is longer than that of the first gate electrode 104 and that between the source electrode 112 and the drain electrode 114 with an oxide semiconductor transistor 100 (referring to (b) in FIG. 4) where a width of the second gate electrode 120 is smaller than that of the first gate electrode 104 and that between the source electrode 112 and the drain electrode 114. It is assumed in FIG. 4 that the width between the source electrode 112 and the drain electrode 114 equals to 15 μm.

Referring to (a) in FIG. 4, in case of the oxide semiconductor transistor 100 where the width of the second gate electrode 120 is longer than that of the first gate electrode 104 and that between the source electrode 112 and the drain electrode 114, a parasitic voltage occurs between the second gate electrode 120 and the source electrode 112/the drain electrode 114, thereby deteriorating characteristics of the oxide semiconductor transistor having high performance electrical characteristics.

Referring to (b) in FIG. 4, in case of the oxide semiconductor transistor 100 where the width of the second gate electrode 120 is smaller than that of the first gate electrode 104 and that between the source electrode 112 and the drain electrode 114 through length adjustment of the second gate electrode 120, it is minimized to occur a parasitic voltage between the second gate electrode 120 and the source electrode 112/the drain electrode 114, and thus high performance electrical characteristics may be achieved. For example, it is preferable that the width of the second gate electrode 120 is a length of 2 μm or more.

In FIG. 1 and FIG. 2, one or more of a width 122 between one terminal of the second gate electrode 120 and the source electrode 112 and a width 124 between the other terminal of the second gate electrode 120 and the drain electrode 114 may have a length of 0.5 μm to 5 μm. That is, the second gate electrode 120 is formed with offset structure of 0.5 μm to 5 μm from the source electrode 112 and the drain electrode 114.

In the event that the second gate electrode 120 locates on the passivation layer 118 and the same voltage is applied to the first gate electrode 104 and the second gate electrode 120, area of a channel formed at the oxide semiconductor layer 108 may be increased. As a result, amount of current flowing through the source electrode 112/the drain electrode 114 may be increased and reliability test about positive voltage, negative voltage and a light may be also stabilized. Accordingly, electrical characteristics of the oxide semiconductor transistor 100 of the display device may be enhanced.

Since the second gate electrode 120 and the connection electrode 122 are formed simultaneously, a process of manufacturing the oxide semiconductor transistor 100 may be simplified. Furthermore, the oxide semiconductor transistor 100 of the display device may have simple structure because a voltage can be simultaneously applied to the gate electrodes 104 and 120 through one electrode.

Figure 5:
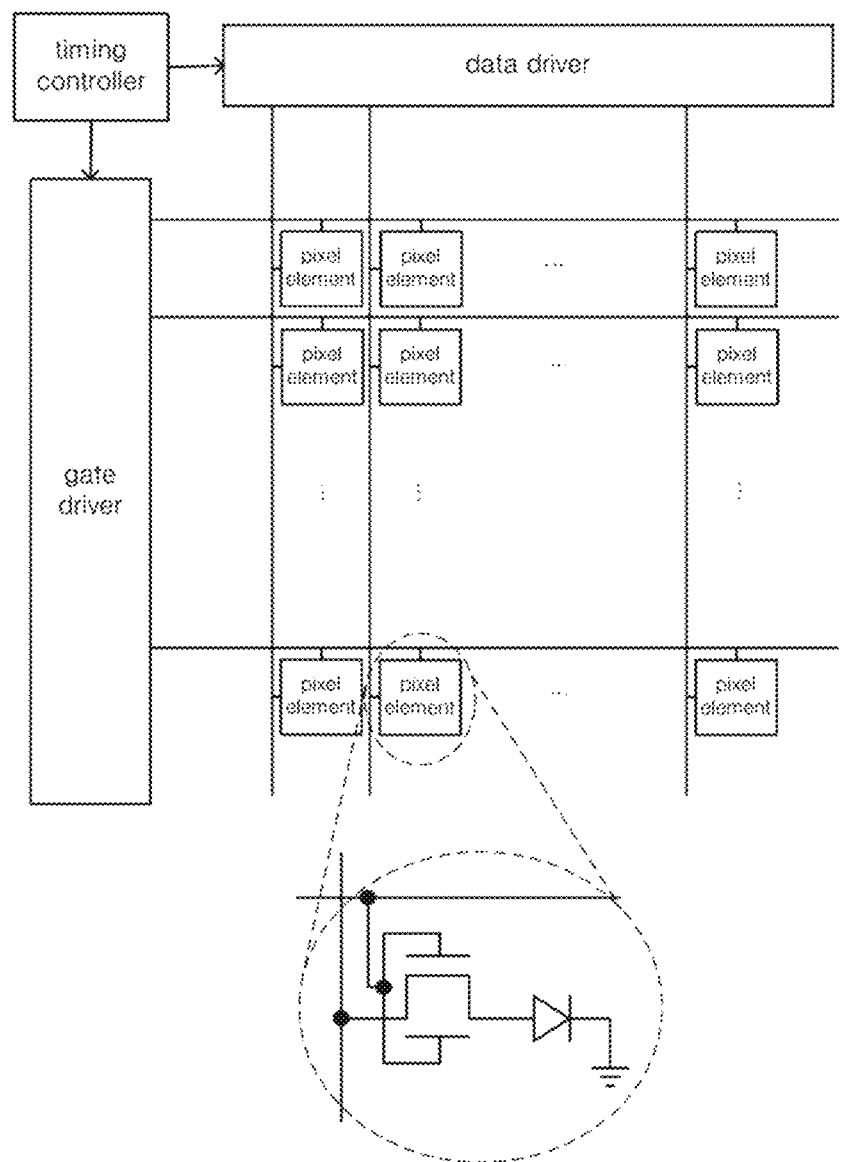
FIG. 5 and FIG. 6 are views illustrating structures applied to an LCD panel (FIG. 5) and an AMOLED panel (FIG. 6) according to one embodiment of the invention.
Figure 6:
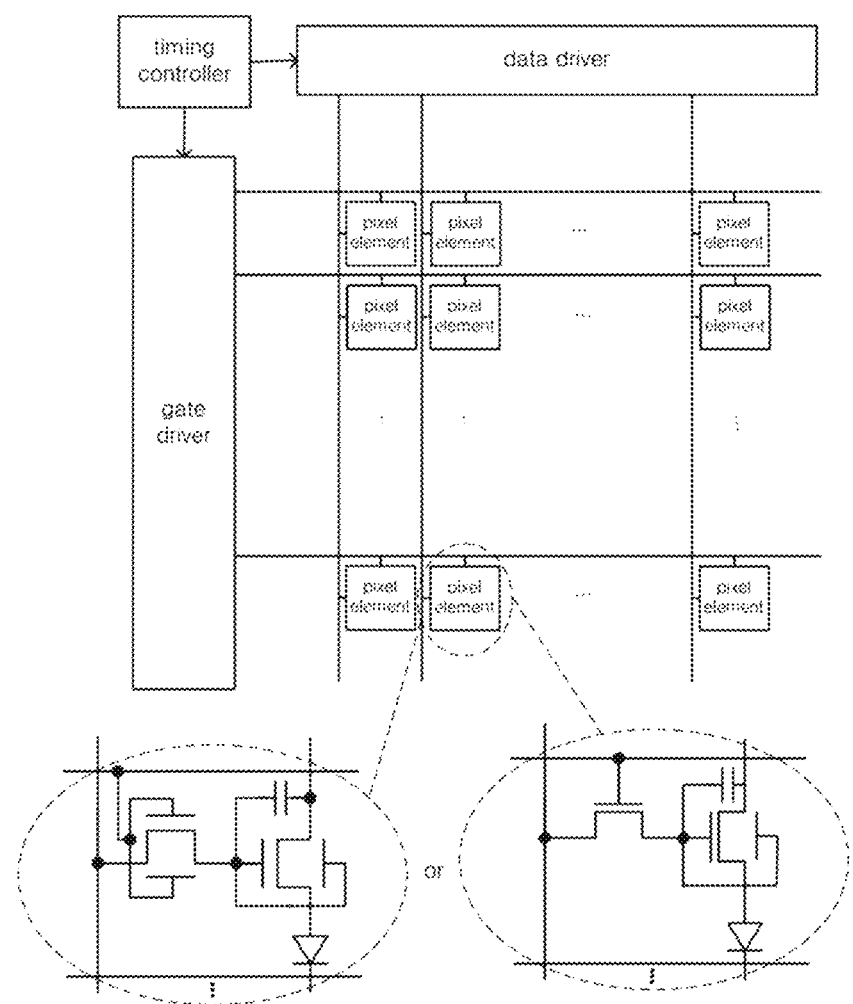

FIG. 5 and FIG. 6 are views illustrating structures applied to an LCD panel (FIG. 5) and an AMOLED panel (FIG. 6) according to one embodiment of the invention.

Referring to the LCD panel with reference to FIG. 5, one oxide semiconductor transistor is included in one pixel element, and a top gate (the second gate electrode 120) and a bottom gate (the first gate electrode 104) are electrically connected to a line of a gate driver.

Referring to the AMOLED panel with reference to FIG. 6, two oxide semiconductor transistors are included in one pixel element. In case of a switching transistor, a top gate and a bottom gate (the second gate electrode 120 and the first gate electrode 104) are electrically connected to a line of a gate driver. In case of a driving transistor, a top gate and a bottom gate (the second gate electrode 120 and the first gate electrode 104) are electrically connected to the other line of the switching transistor (a line except the line of the gate driver to which the top gate and the bottom gate are connected and a line connected electrically to the data driver).

Hereinafter, electrical characteristics of the oxide semiconductor transistor 100 of the display device according to one embodiment of the invention will be described in detail with reference to accompanying drawings FIG. 7 to FIG. 22.

FIG. 7 is a view illustrating a graph showing a transfer curve of the oxide semiconductor transistor 100 according to one embodiment of the invention. Referring to FIG. 7, it is verified that the electrical characteristics of the oxide semiconductor transistor 100 are considerably enhanced compared with a transistor including single gate in the event that width/length W/L of a channel of the oxide semiconductor transistor 100 is 20 μm/11 μm and 50 μm/11 μm.

FIG. 8 is a view illustrating a graph showing drain current ((a) in FIG. 8) and a threshold voltage ((b) in FIG. 8) of the oxide semiconductor transistor 100 according to one embodiment of the invention. Referring to FIG. 8, it is verified that uniformity of the oxide semiconductor transistor 100 is enhanced compared with a transistor including single gate in the event that width/length W/L of the channel of the oxide semiconductor transistor 100 is 20 μm/11 μm.

Figure 9:
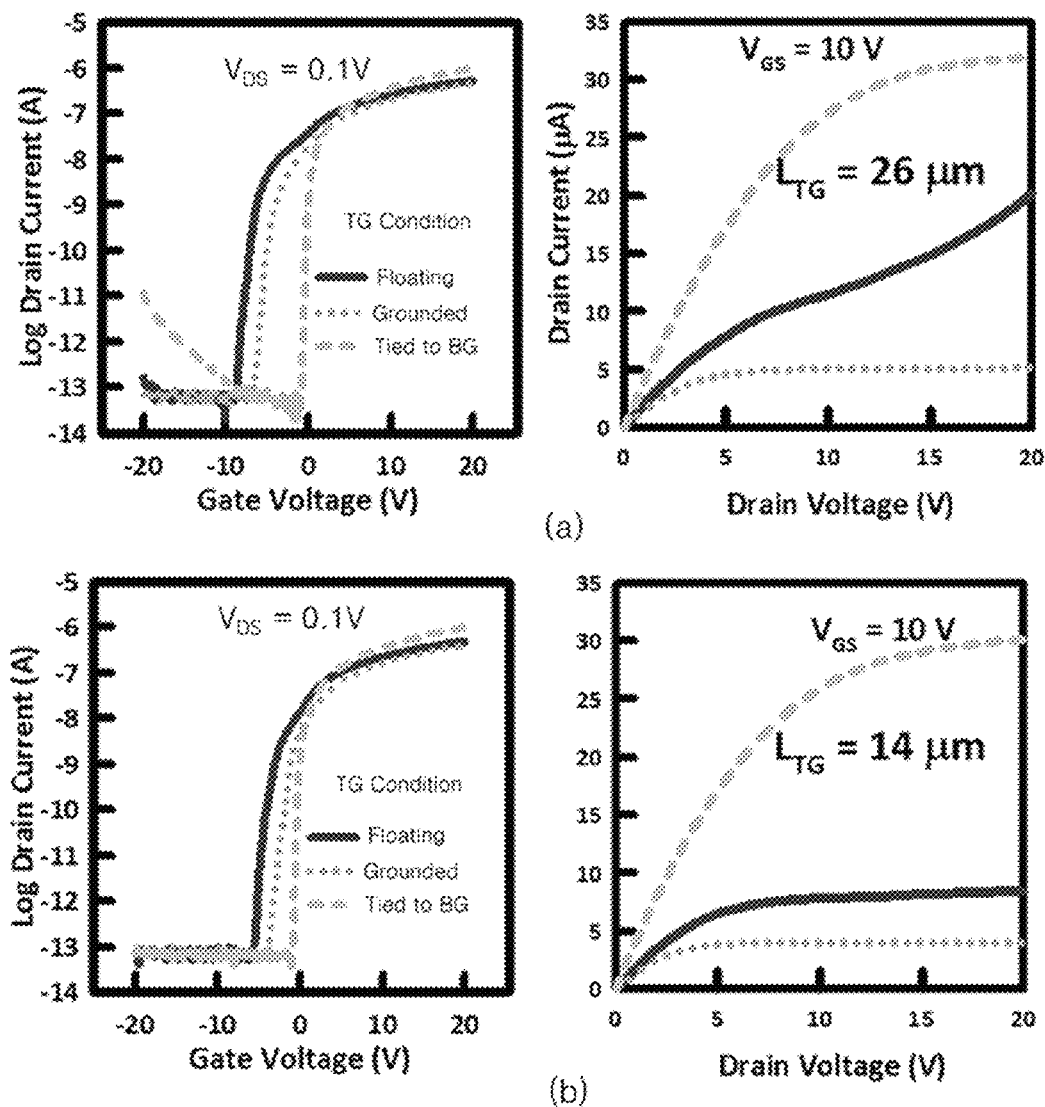
FIG. 9 and FIG. 10 are views illustrating graphs showing a transfer curve and an output curve when width of the second gate electrode 120 in the oxide semiconductor transistor 100 is 26 µm/15 µm/12 µm according to one embodiment of the invention.
Figure 10:
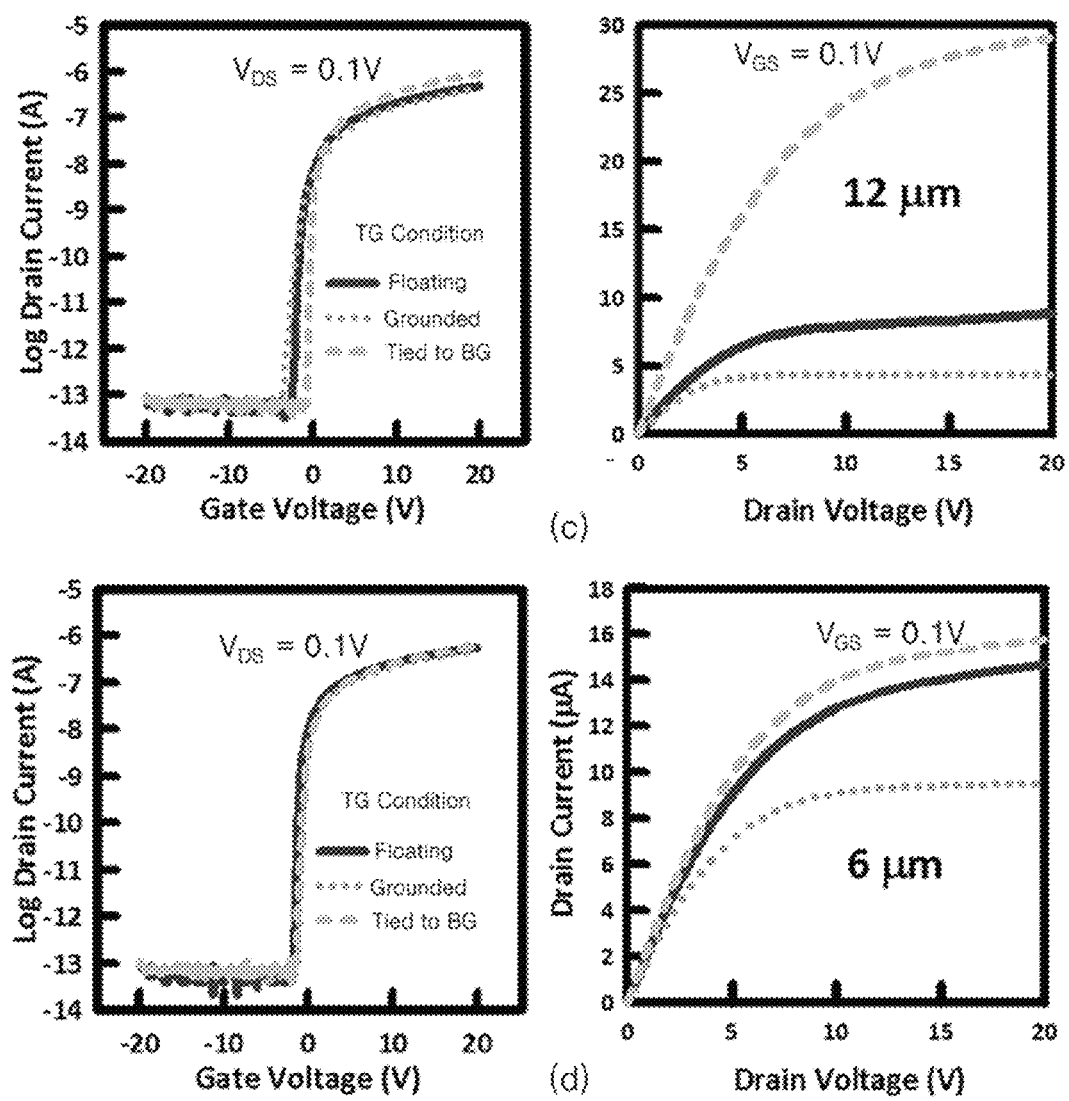

FIG. 9 and FIG. 10 are views illustrating graphs showing a transfer curve and an output curve when width of the second gate electrode 120 in the oxide semiconductor transistor 100 is 26 μm ((a) in FIG. 9)/15 μm ((b) in FIG. 9)/12 μm ((a) in FIG. 10)/6 μm ((b) in FIG. 10) according to one embodiment of the invention. Referring to FIG. 9 and FIG. 10, in the event that the width of the second gate electrode 120 is 26 μm, the width of the second gate electrode 120 equals to that of the first gate electrode 104 and is longer than that between the source electrode 112 and the drain electrode 114. In the event that the width of the second gate electrode 120 is 15 μm, the width of the second gate electrode 120 equals to that between the source electrode 112 and the drain electrode 114. In the event that the width of the second gate electrode 120 is 12 μm/6 μm, the width of the second gate electrode 120 is shorter than that of the first gate electrode 104 and is smaller than that between the source electrode 112 and the drain electrode 114.

Figure 11:
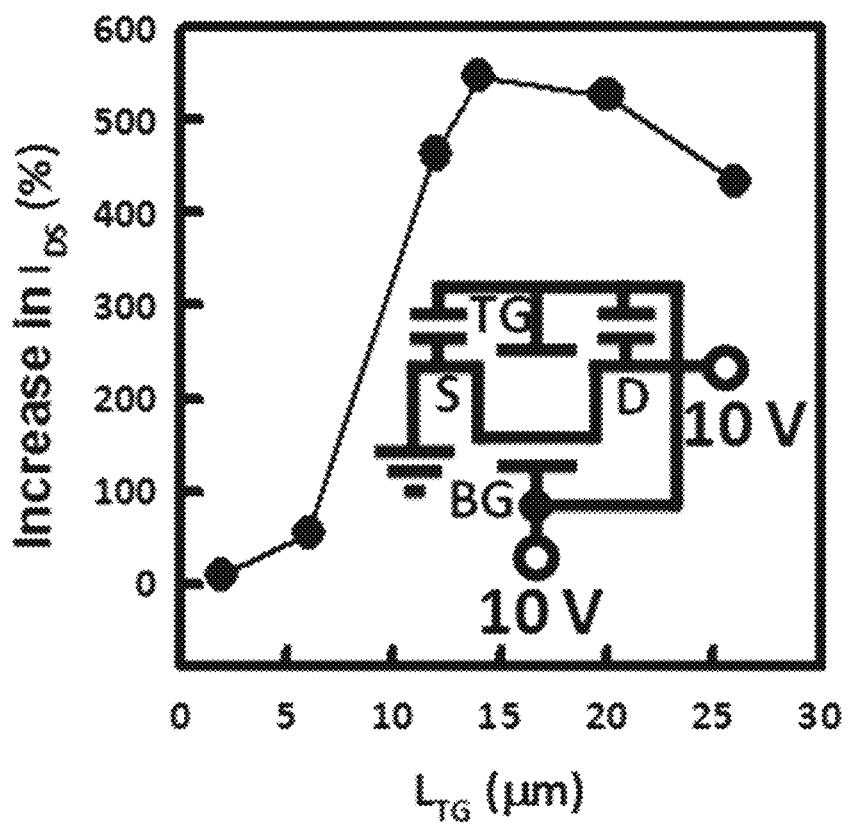
FIG. 11 is a view illustrating a graph showing with percentage drain current increased (increase in) depending on size (LTC) of the top gate according to one embodiment of the invention.

FIG. 11 is a view illustrating a graph showing with percentage drain current increased (increase in) when 10V is respectively applied to a gate and a drain of the oxide semiconductor transistor 100, depending on size (LTC) of the top gate (the second gate electrode 120) according to one embodiment of the invention.

Figure 12:
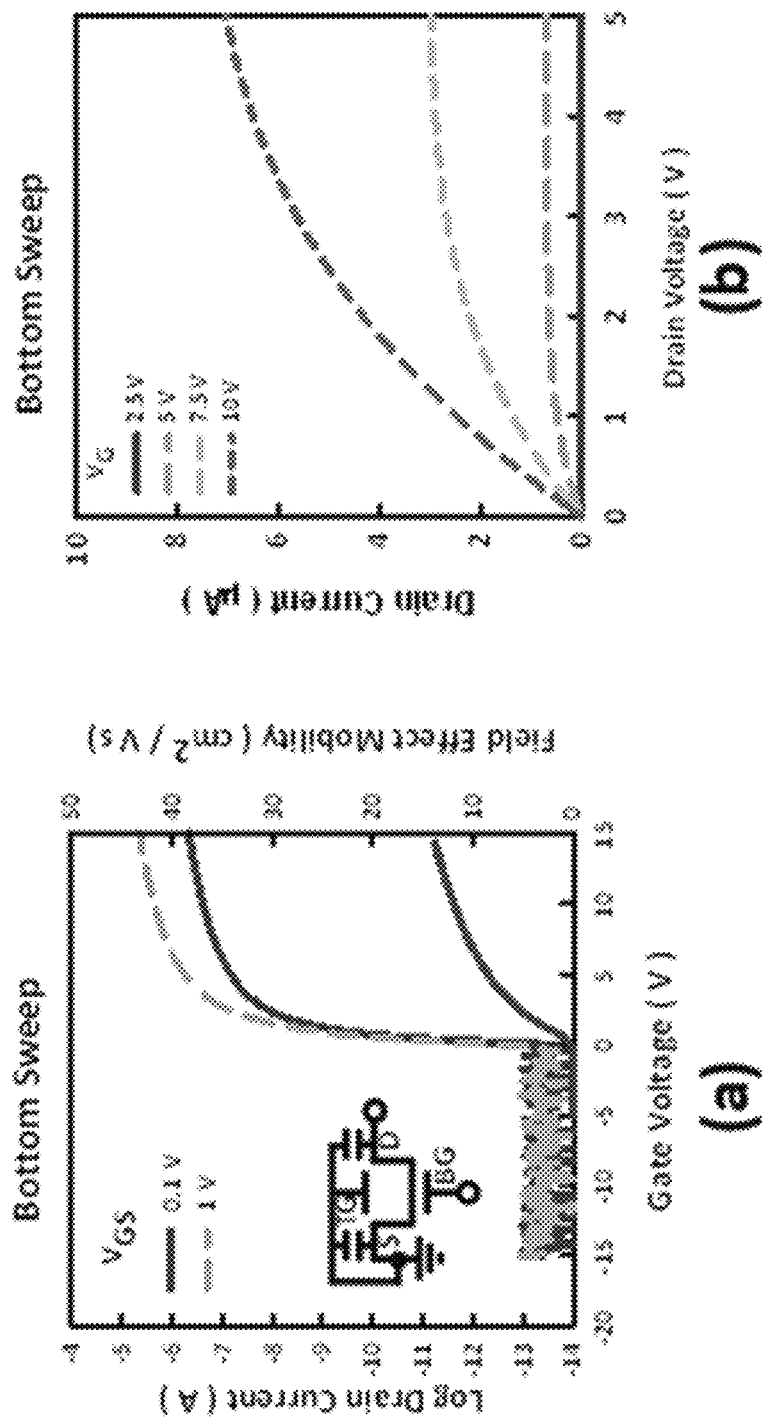
FIG. 12 and FIG. 13 are views illustrating electrical characteristics according to a first embodiment and a second embodiment of the invention.
Figure 13:
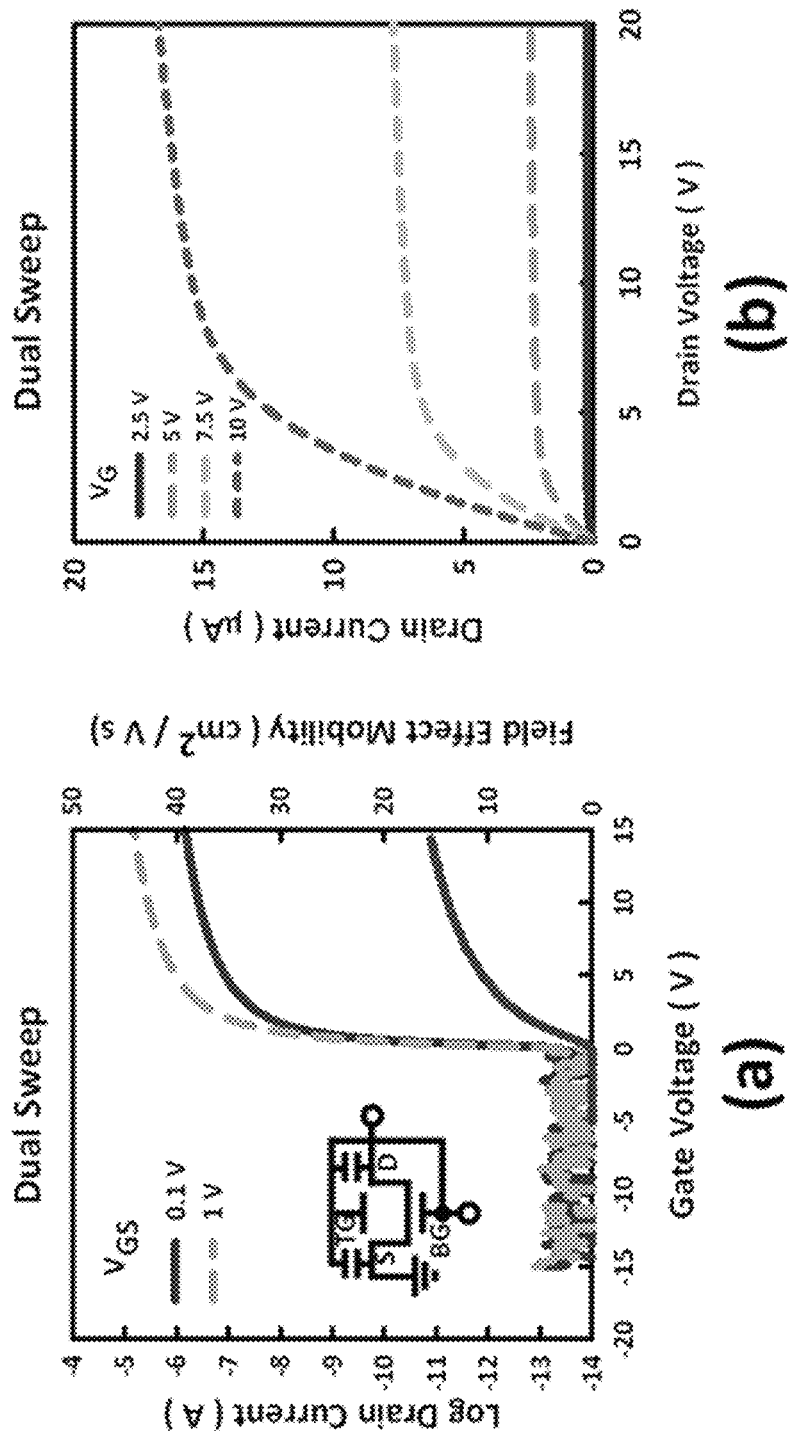

FIG. 12 is a view illustrating electrical characteristics of the oxide semiconductor transistor where the first gate electrode 104 and the second gate electrode 120 are not connected through the connection electrode 122 according to a first embodiment of the invention. FIG. 13 is a view illustrating electrical characteristics of the oxide semiconductor transistor where the first gate electrode 104 and the second gate electrode 120 are connected via the connection electrode 122 according to a second embodiment of the invention.

In FIG. 12 and FIG. 13, compared with the first embodiment of the invention, the second embodiment may increase more maximum value of current flowing through the drain electrode 114.

Figure 14:
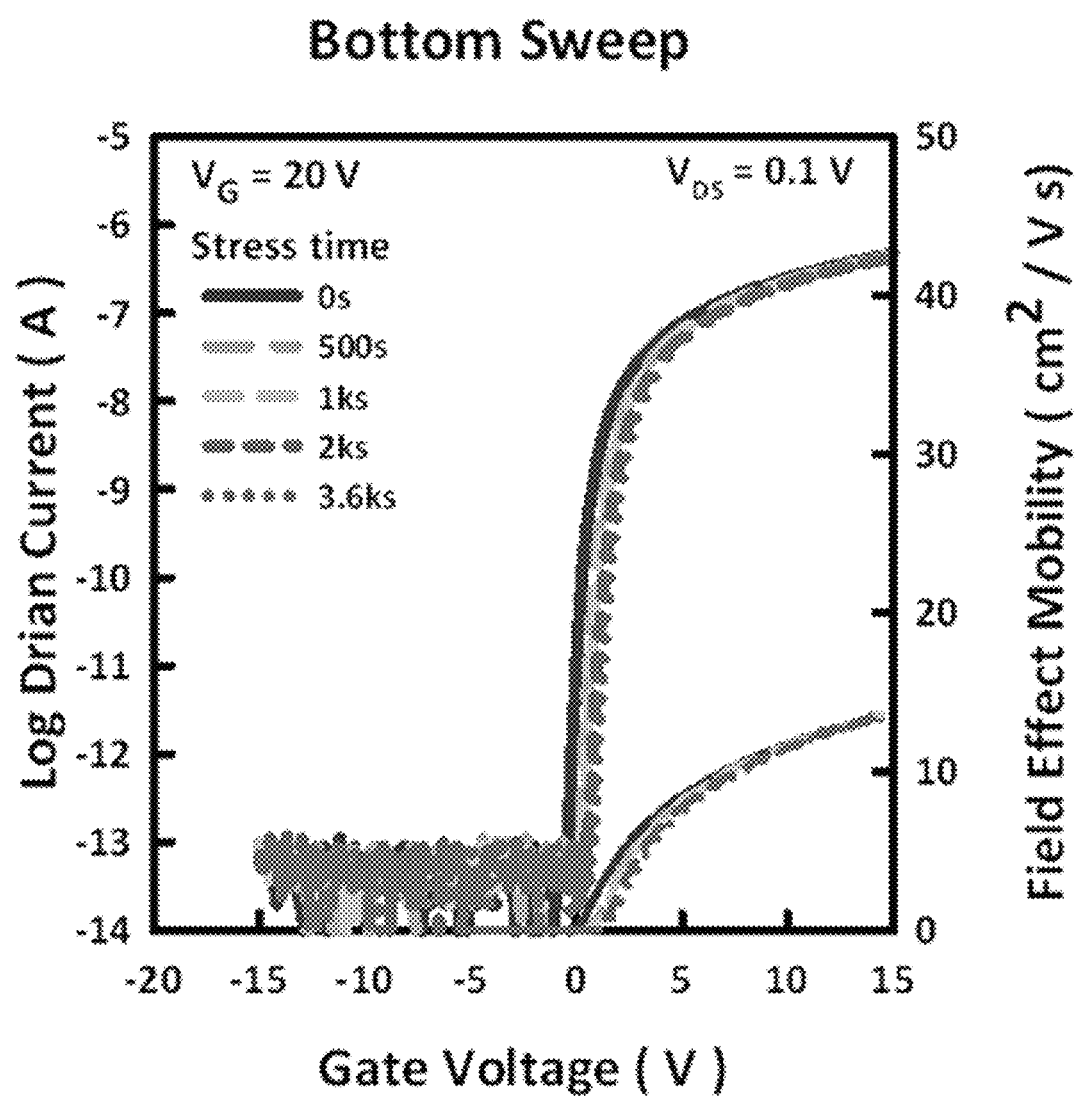
FIG. 14 and FIG. 15 are views illustrating electrical characteristics when positive 20V is applied in the first embodiment and the second embodiment.
Figure 15:
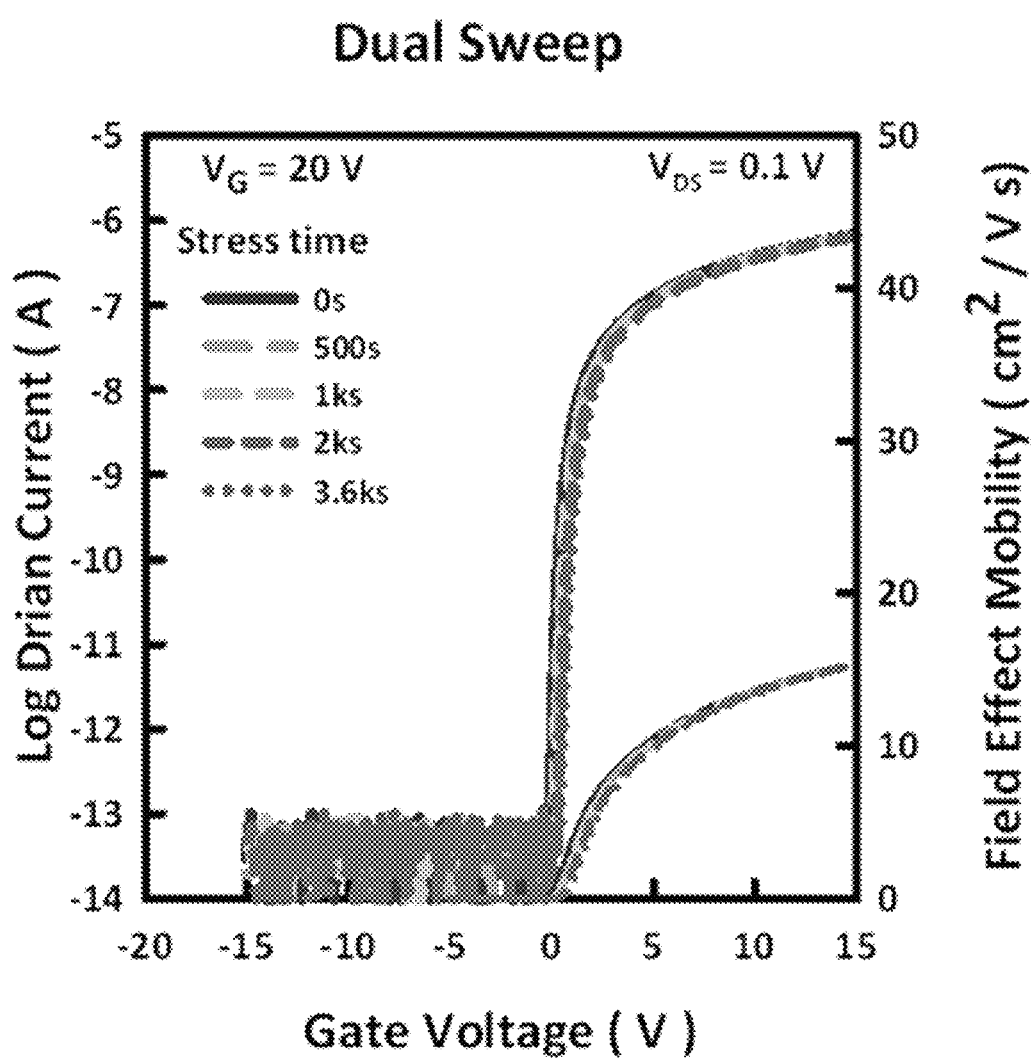
Figure 16:
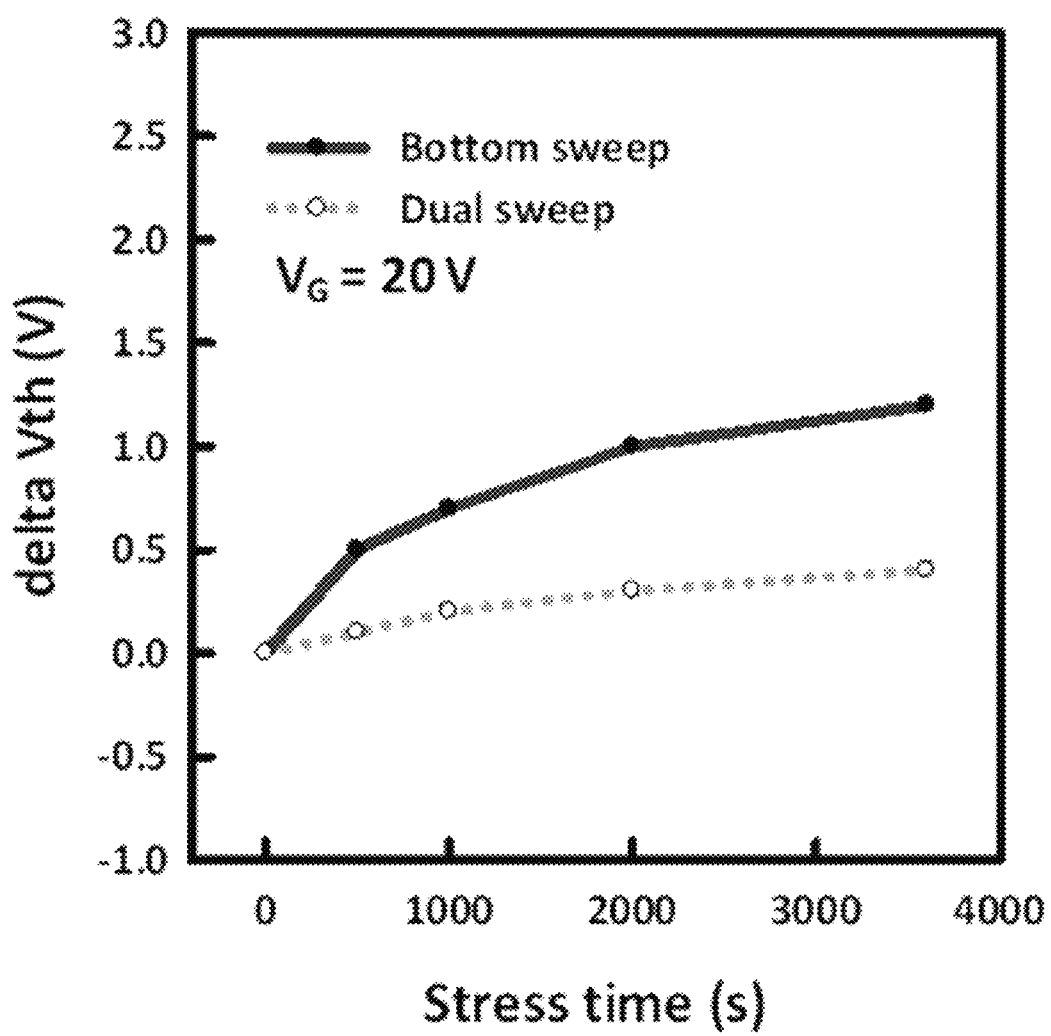
FIG. 16 to FIG. 22 are views illustrating when negative voltage −20V/−30V is applied in the first embodiment and the second embodiment.

FIG. 14 is a view illustrating electrical characteristics of the oxide semiconductor transistor when positive voltage 20V is applied in the first embodiment, FIG. 15 is a view illustrating electrical characteristics of the oxide semiconductor transistor when positive voltage 20V is applied in the second embodiment, and FIG. 16 is a view illustrating a graph showing changing of a threshold voltage after reliability test is estimated in the first embodiment and the second embodiment.

Referring to FIG. 14 to FIG. 16, it is verified that the oxide semiconductor transistor in the second embodiment has better reliability than the oxide semiconductor transistor in the first embodiment.

Figure 17:
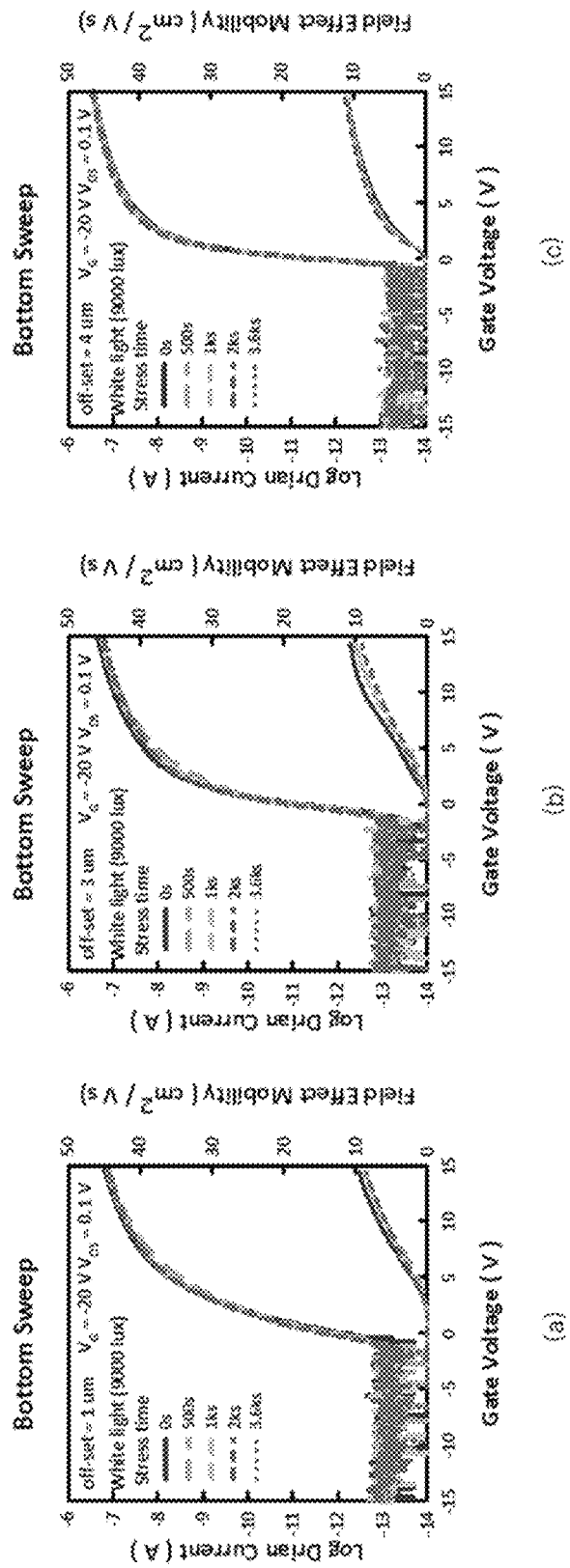
Figure 18:
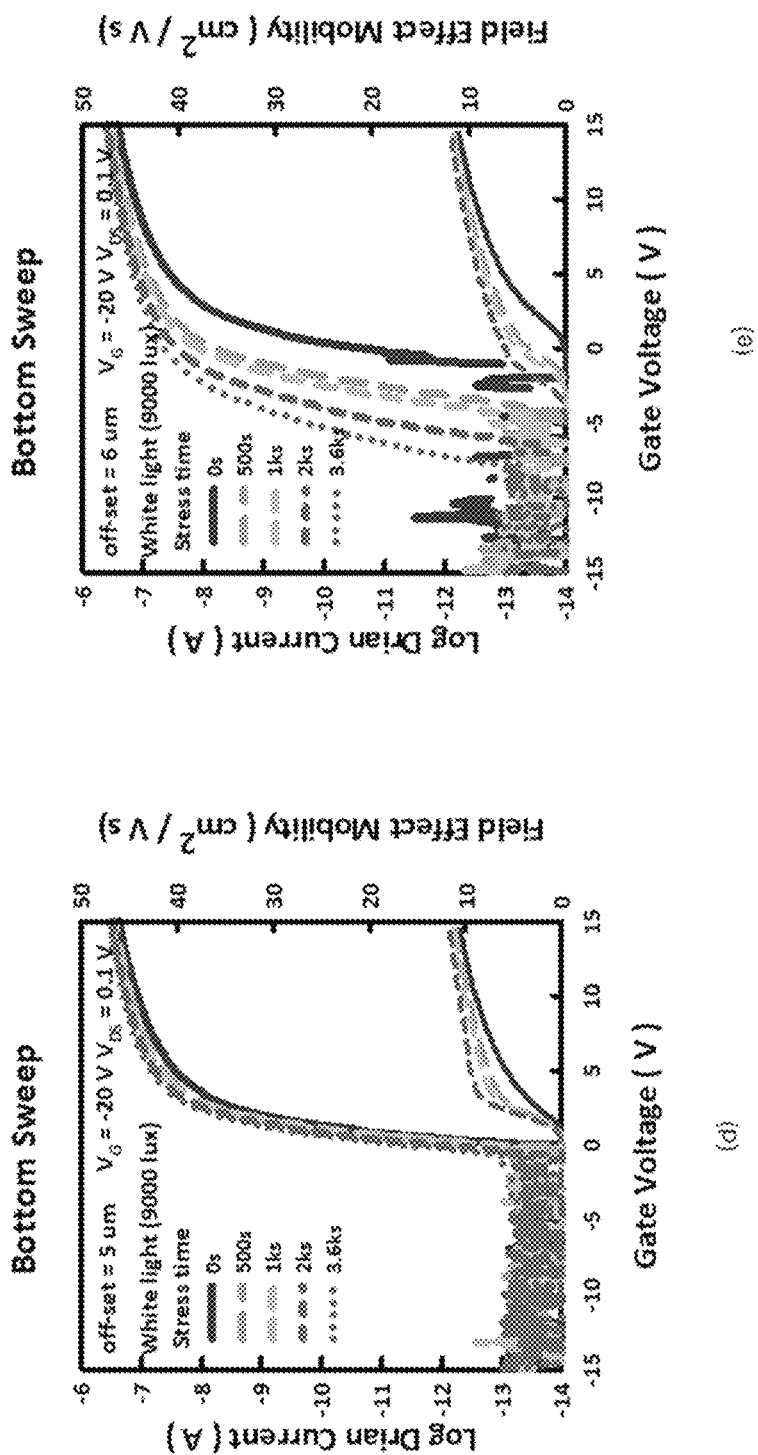
Figure 19:
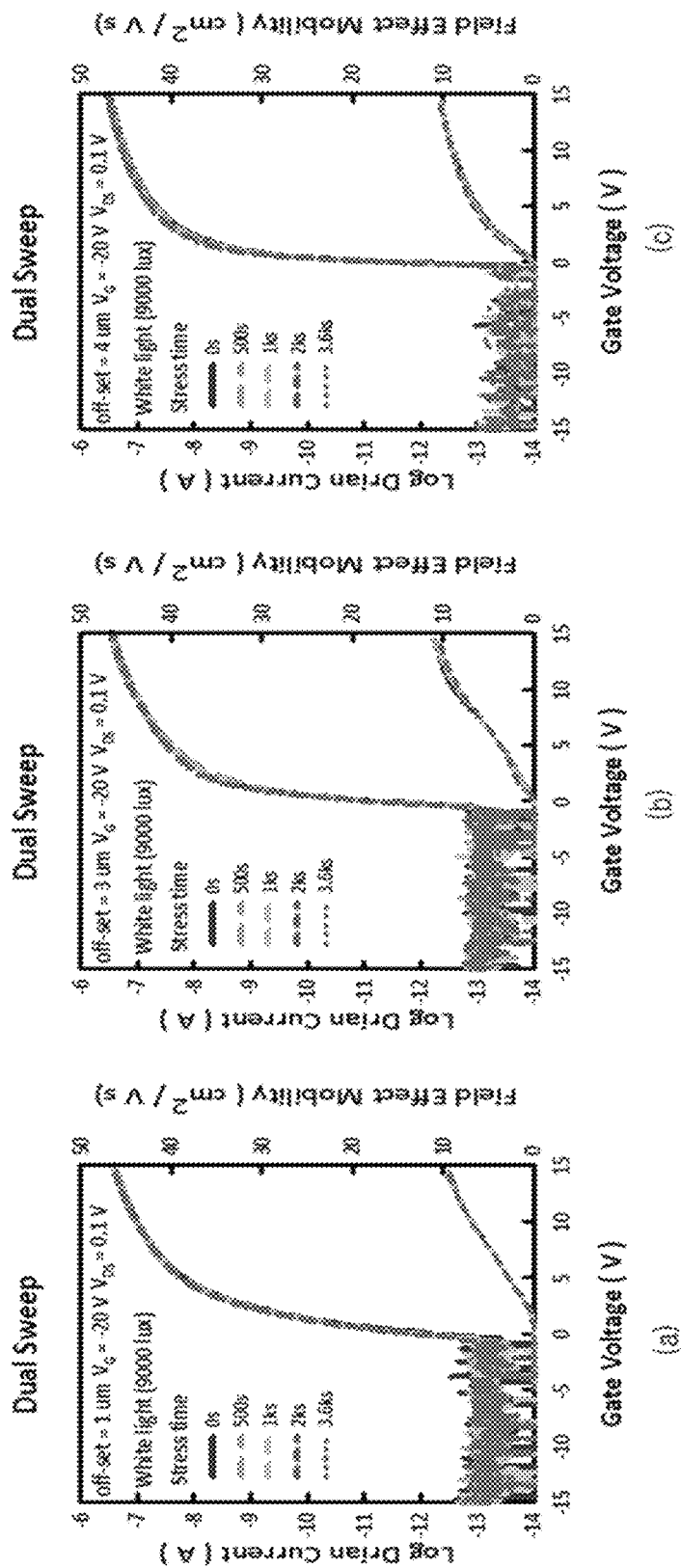
Figure 20:
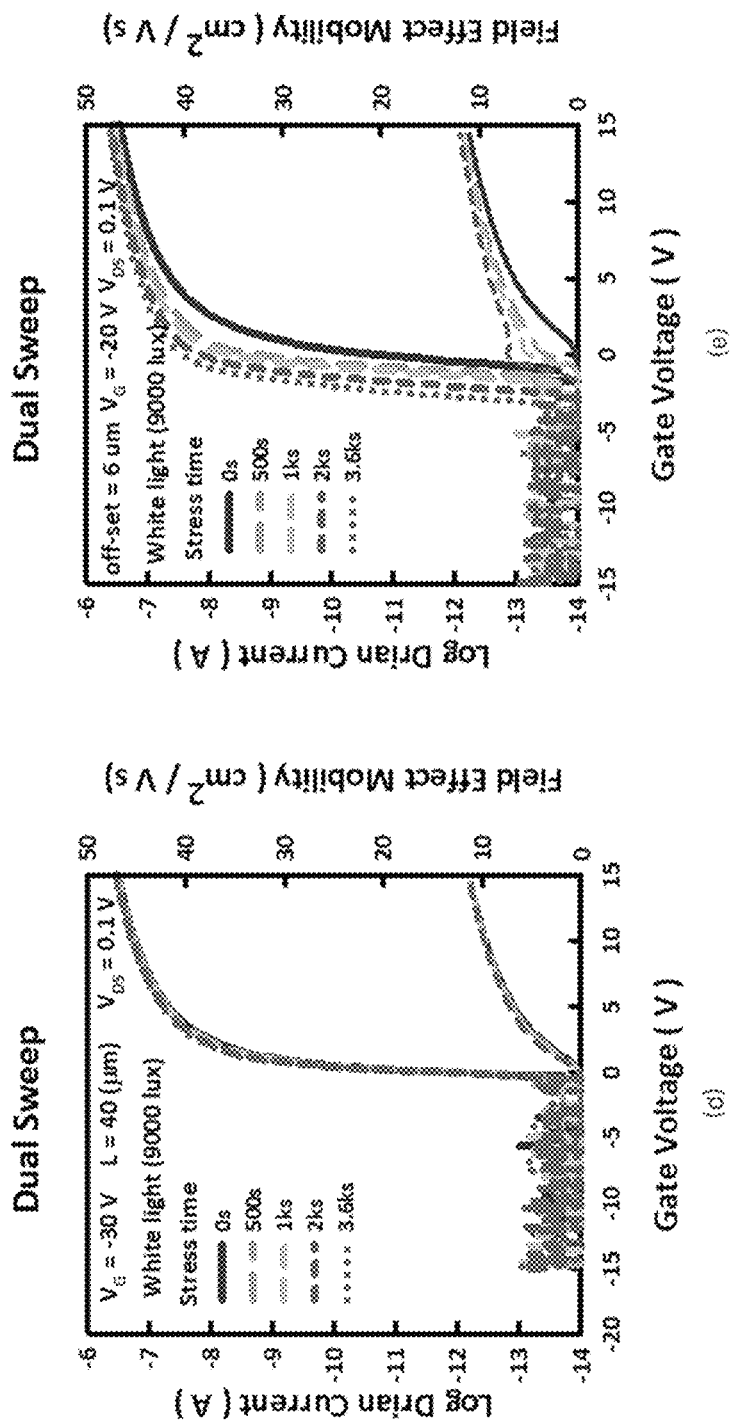

FIG. 17 and FIG. 18 are views illustrating electrical characteristics of the oxide semiconductor transistor when negative voltage −20V is applied in the first embodiment, and FIGS. 19 and 20 are views illustrating electrical characteristics of the oxide semiconductor transistor when negative voltage −20V is applied in the second embodiment. Here, distance between one terminal/other terminal of the second gate electrode 120 and the source electrode 112/the drain electrode 114, i.e. offset is 1 μm ((a) in FIG. 17, (a) in FIG. 19)/3 μm ((b) in FIG. 17, (b) in FIG. 19)/4 μm ((c) in FIG. 17, (c) in FIG. 19)/5 μm ((a) in FIG. 18, (a) in FIG. 20)/6 μm ((b) in FIG. 18, (b) in FIG. 20).

Referring to FIG. 17 to FIG. 20, it is verified that the oxide semiconductor transistor has excellent characteristics in NBIS reliability test when length of the offset is 5 μm or less, and characteristics of the oxide semiconductor transistor is changed in the NBIS reliability test when the length of the offset is 6 μm or more.

Figure 21:
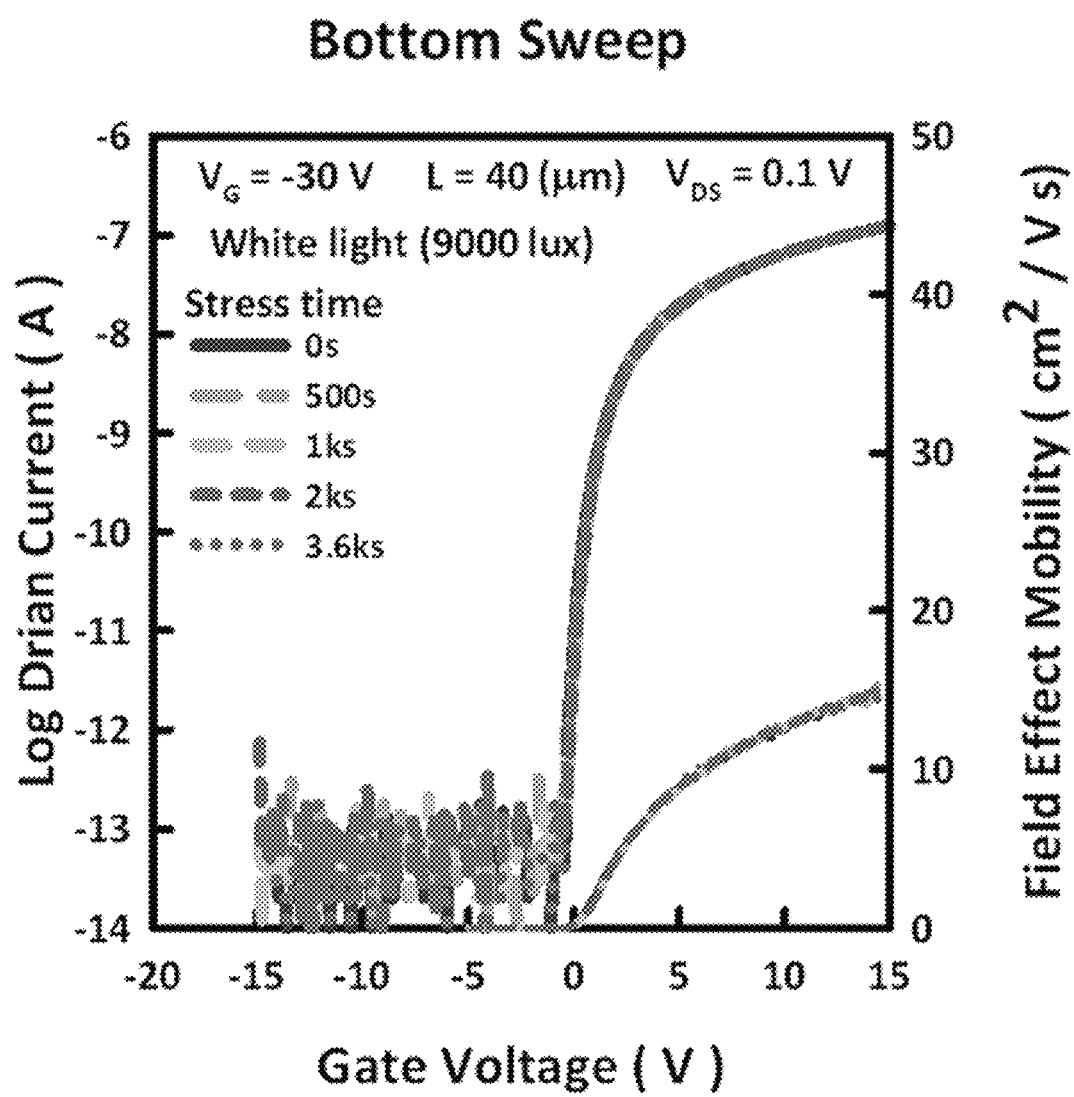
Figure 22:
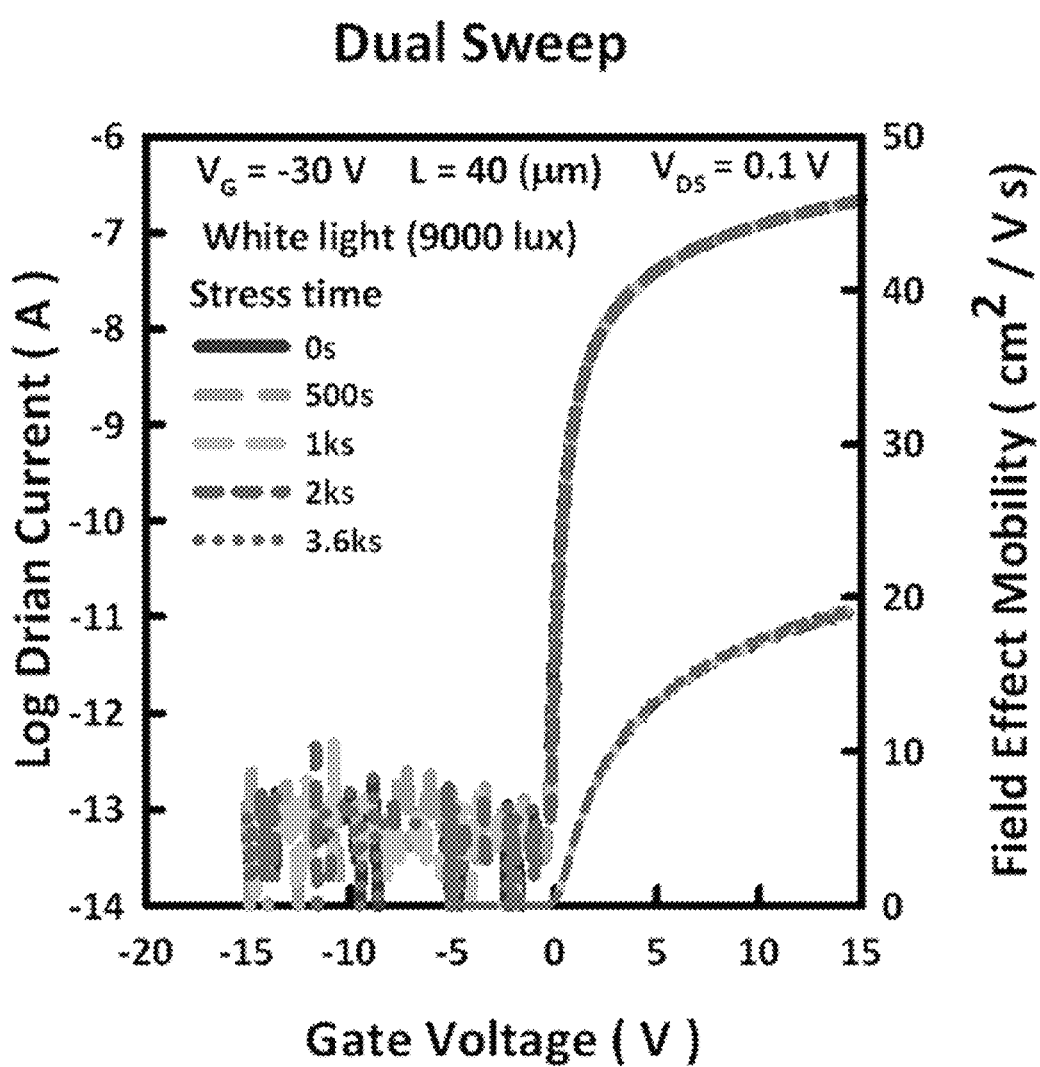

FIG. 21 and FIG. 22 are views illustrating electrical characteristics of the oxide semiconductor transistor when high negative voltage −30V is applied in the first embodiment and the second embodiment.

Referring to FIG. 21 and FIG. 22, it is verified that reliability in illumination stress of 9000 lux is considerably enhanced according as the length of the channel increases.

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

The invention claimed is:

1. An oxide semiconductor transistor used in a pixel element of a display device, the oxide semiconductor transistor comprising:
a substrate;
a first gate electrode located on the substrate;
a source electrode and a drain electrode located on the first gate electrode; and
a second gate electrode located on the source electrode and the drain electrode, wherein
the first gate electrode is electrically connected to the second gate electrode,
the same voltage is applied to the first gate electrode and the second gate electrode,
a width of the second gate electrode is shorter than a length between the source electrode and the drain electrode, and
an offset indicating a distance between one terminal of the second gate electrode and the source electrode or a distance between another terminal of the second gate electrode and the drain electrode is 0.5μm to 5μm.

2. The oxide semiconductor transistor of the claim 1, wherein the width of the second gate electrode is 2μm or more.

3. The oxide semiconductor transistor of claim 1, further comprising:
a connection electrode configured to connect electrically the first gate electrode to the second gate electrode.

4. The oxide semiconductor transistor of claim 1, further comprising:
a gate insulator located between the first gate electrode and the source electrode/the drain electrode;
an oxide semiconductor layer located between the gate insulator and the source electrode/the drain electrode; and
a passivation layer located between the source electrode/the drain electrode and the second gate electrode.

5. The oxide semiconductor transistor of claim 4, wherein the source electrode and the drain electrode are disposed in parallel with each other,
the oxide semiconductor transistor further comprises an etch stopper of which a part or more locates between the source electrode and the drain electrode.

6. The oxide semiconductor transistor of claim 5, wherein at least one of the gate insulator, the etch stopper and the passivation layer is made up of an oxide or a metal oxide.

7. The oxide semiconductor transistor of claim 1, wherein an oxide semiconductor layer has an amorphous or polycrystalline structure formed with any one of an indium gallium zinc oxide IGZO, a zinc oxide ZnO, an indium zinc oxide IZO, an indium tin oxide ITO, a zinc tin oxide ZTO, a gallium zinc oxide GZO, a hafnium indium zinc oxide HIZO, a zinc indium tin oxide ZITO and an aluminum zinc oxide AZTO.

8. An oxide semiconductor transistor used in a pixel element of a display device, the oxide semiconductor transistor comprising:
a substrate;
a first gate electrode located on the substrate;
a source electrode and a drain electrode located on the first gate electrode; and
a second gate electrode located on the source electrode and the drain electrode, wherein the first gate electrode and the second gate electrode are located on the same axis,
a width of the second gate electrode is shorter than a width of the first gate electrode,
the first gate electrode is electrically connected to the second gate electrode,
the same voltage is applied to the first gate electrode and the second gate electrode, and
an offset indicating a distance between one terminal of the second gate electrode and the source electrode or a distance between another terminal of the second gate electrode and the drain electrode is 0.5μm to 5μm.

9. The oxide semiconductor transistor of claim 8, wherein the width of the second gate electrode is shorter than a length between the source electrode and the drain electrode.

* * * * *